(12) United States Patent
Kwon et al.

(10) Patent No.: US 9,791,537 B2
(45) Date of Patent: Oct. 17, 2017

(54) TIME DELAY ESTIMATION APPARATUS AND TIME DELAY ESTIMATION METHOD THEREFOR

(71) Applicant: KOREA RESEARCH INSTITUTE OF STANDARDS AND SCIENCE, Daejeon (KR)

(72) Inventors: Hyu-Sang Kwon, Daejeon (KR); WanHo Cho, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/315,017

(22) PCT Filed: May 22, 2015

(86) PCT No.: PCT/KR2015/005206
§ 371 (c)(1),
(2) Date: Nov. 30, 2016

(87) PCT Pub. No.: WO2015/182936
PCT Pub. Date: Dec. 3, 2015

(65) Prior Publication Data
US 2017/0192080 A1    Jul. 6, 2017

(30) Foreign Application Priority Data

May 30, 2014  (KR) .................. 10-2014-0065798

(51) Int. Cl.
*H04R 3/00* (2006.01)
*G01S 3/808* (2006.01)
(Continued)

(52) U.S. Cl.
CPC ............... *G01S 3/808* (2013.01); *G01H 3/00* (2013.01); *G01R 31/316* (2013.01); *G01S 13/28* (2013.01); *H04R 1/40* (2013.01); *H04R 3/00* (2013.01)

(58) Field of Classification Search
CPC .. H04R 3/00; H04R 1/40; G01S 3/808; G01S 13/28; G01H 3/00; G01R 31/316
(Continued)

(56) References Cited

U.S. PATENT DOCUMENTS 6,291,979 B1    9/2001  Soma et al.
6,400,129 B1    6/2002  Yamaguchi et al.
(Continued)

FOREIGN PATENT DOCUMENTS

JP    2000-235063 A    8/2000
JP    2003-337164 A    11/2003
(Continued)

OTHER PUBLICATIONS

International Search Report PCT/ISA/210 for International Application No. PCT/KR2015/005206 dated Jul. 14, 2015.
(Continued)

*Primary Examiner* — Paul S Kim
(74) *Attorney, Agent, or Firm* — Harness, Dickey & Pierce P.L.C.

(57) ABSTRACT

The present invention relates to a time delay estimation device. The time delay estimation device of the present invention includes a sound signal detection unit configured to detect sound signals through a plurality of microphones, a frequency domain conversion unit configured to convert the detected sound signals into signals of a frequency domain, and a time delay estimation unit configured to
(Continued)

estimate a time delay on the basis of a slope of a phase difference between the sound signals converted into the frequency domain.

10 Claims, 3 Drawing Sheets

(51) Int. Cl.
  *G01H 3/00* (2006.01)
  *H04R 1/40* (2006.01)
  *G01S 13/28* (2006.01)
  *G01R 31/316* (2006.01)
(58) Field of Classification Search
  USPC .......................................................... 381/92
  See application file for complete search history.

(56) References Cited

U.S. PATENT DOCUMENTS 7,970,609 B2    6/2011  Hayakawa
2008/0040101 A1*  2/2008  Hayakawa .......... G10L 21/0208
                                                                 704/203

FOREIGN PATENT DOCUMENTS

JP          2007-298503 A    11/2007
KR     10-2008-0013734 A    2/2008

OTHER PUBLICATIONS

Written Opinion of the International Searching Authority PCT/ISA/237 for International Application No. PCT/KR2015/005206 dated Jul. 14, 2015.

* cited by examiner

TIME DELAY ESTIMATION APPARATUS AND TIME DELAY ESTIMATION METHOD THEREFOR

CROSS-REFERENCE TO RELATED APPLICATIONS

This application is the U.S. National Phase application of PCT Application No. PCT/KR2015/005206 filed on May 22, 2015, which claims priority to Korean Patent Application No. 10-2014-0065798 filed on May 30, 2014, the entire contents of each of which are incorporated herein by reference.

TECHNICAL FIELD

The present invention disclosed herein relates to a location detection system, and more particularly, to a time delay estimation device for estimating a time delay which has occurred in a sound signal and a time delay estimation method therefor.

BACKGROUND ART

A triangulation method or a circle intersection method, in which hyperbolas or circles are formed using two or more sound sensors as focuses or centers and an intersection point thereof is determined as the location of a point, is used to estimate location of a sound source by using a sound signal.

A sound sensor arrangement and a sound signal arrival time difference are used to estimate a location by using a sound signal, and representative techniques for this estimation include an angle of arrival (AoA) technique, a time of arrival (ToA) technique, a time difference of arrival (TDoA) technique, etc.

According to the AoA technique, a location is measured by measuring angles of arrival and arrival time differences of received sound signals. According to the ToA technique, a location is measured using information about a time at which a sound signal arrives at one reference sound sensor and times at which sound signals arrive at two or more sound sensors, and for this technique, time synchronization between the sound sensors is required, and an error caused by a multipath should be considered. According to the TDoA technique, a location is measured using a difference of times at which sound signals arrive at a plurality of sound sensors, and this technique enables long-distance measurement using time difference information.

According to the above-mentioned location estimation techniques, sound signals are detected to accurately determine the location of a sound source which has generated the sound signals. Here, according to the above-mentioned location estimation techniques, a difference of times of the sound signals is measured using the detected sound signals. Regarding the measurement of the time difference, time delays of the sound signals significantly affect the performance of location estimation. Various methods for estimating time delays of sound signals have been proposed, but are limited in terms of the accuracy of time delay estimation.

DISCLOSURE OF THE INVENTION

Technical Problem

The present invention provides a time delay estimation device capable of accurately estimating a time delay of a sound source and a time delay estimation method therefor.

Technical Solution

Embodiments of the present invention provides a time delay estimation device including: a sound signal detection unit configured to detect sound signals through a plurality of microphones; a frequency domain conversion unit configured to convert the detected sound signals into signals of a frequency domain; and a time delay estimation unit configured to estimate a time delay on the basis of a slope of a phase difference between the sound signals converted into the frequency domain.

In an embodiment, the sound signal detection unit may include: a sound signal measurement unit configured to measure sound signals from the plurality of microphones; a trigger unit configured to trigger the measured sound signals to extract waveforms of the sound signals; and a waveform selection unit configured to select the extracted waveforms of the sound signals to detect sound signals for each of the plurality of microphones.

In an embodiment, the waveform selection unit may generate the sound signals by zero-padding the selected waveforms.

In an embodiment, the frequency domain conversion unit may convert the detected sound signals into the signals of the frequency domain through fast Fourier transform.

In an embodiment, the time delay estimation device may include: a phase difference calculation unit configured to calculate phase differences among the plurality of microphones and estimate the time delay on the basis of slopes of the calculated phase differences; a direction vector estimation unit configured to estimate a direction vector on the basis of the time delay; and a center position correction unit configured to generate average signal data through center position correction of a signal of each of the plurality of microphones on the basis of the estimated direction vector.

In an embodiment, the phase difference calculation unit may adjust, on the basis of the calculated phase differences, positions of reference times respectively applied to the waveforms selected in the waveform selection unit, so as to satisfy a condition for the slope to converge to 0.

In other embodiments of the present invention, a time delay estimation method for a time delay estimation device includes: detecting sound signals through a plurality of microphones; converting the detected sound signals into signals of a frequency domain; and estimating a time delay on the basis of a slope of a phase difference between the sound signals converted into the frequency domain.

In an embodiment, the detecting the sound signals may include: measuring sound signals from the plurality of microphones; extracting waveforms of the sound signals by triggering the measured sound signals; and detecting sound signals for each of the plurality of microphones by selecting the extracted waveforms of the sound signals.

In an embodiment, the extracting the waveforms of the sound signals may include generating the sound signals by zero-padding the selected waveforms.

In an embodiment, the converting the detected sound signals into the signals of the frequency domain may include converting the detected sound signals into the signal of the frequency domain through fast Fourier transform.

In an embodiment, the estimating the time delay may include: calculating phase differences among the plurality of microphones and estimating the time delay from slopes of the calculated phase differences; estimating a direction vector on the basis of the time delay; and generating average signal data through center position correction of a signal of each of the plurality of microphones on the basis of the estimated direction vector.

In an embodiment, the estimating the time delay may include adjusting, on the basis of the calculated phase differences, positions of reference times respectively applied to the selected waveforms, so as to satisfy a condition for the slope to converge to 0.

Advantageous Effects

The time delay estimation device of the present invention may accurately estimate a time delay through estimation of a slope of a phase change of a frequency domain.

BEST MODE FOR CARRYING OUT THE INVENTION

Figure 1:
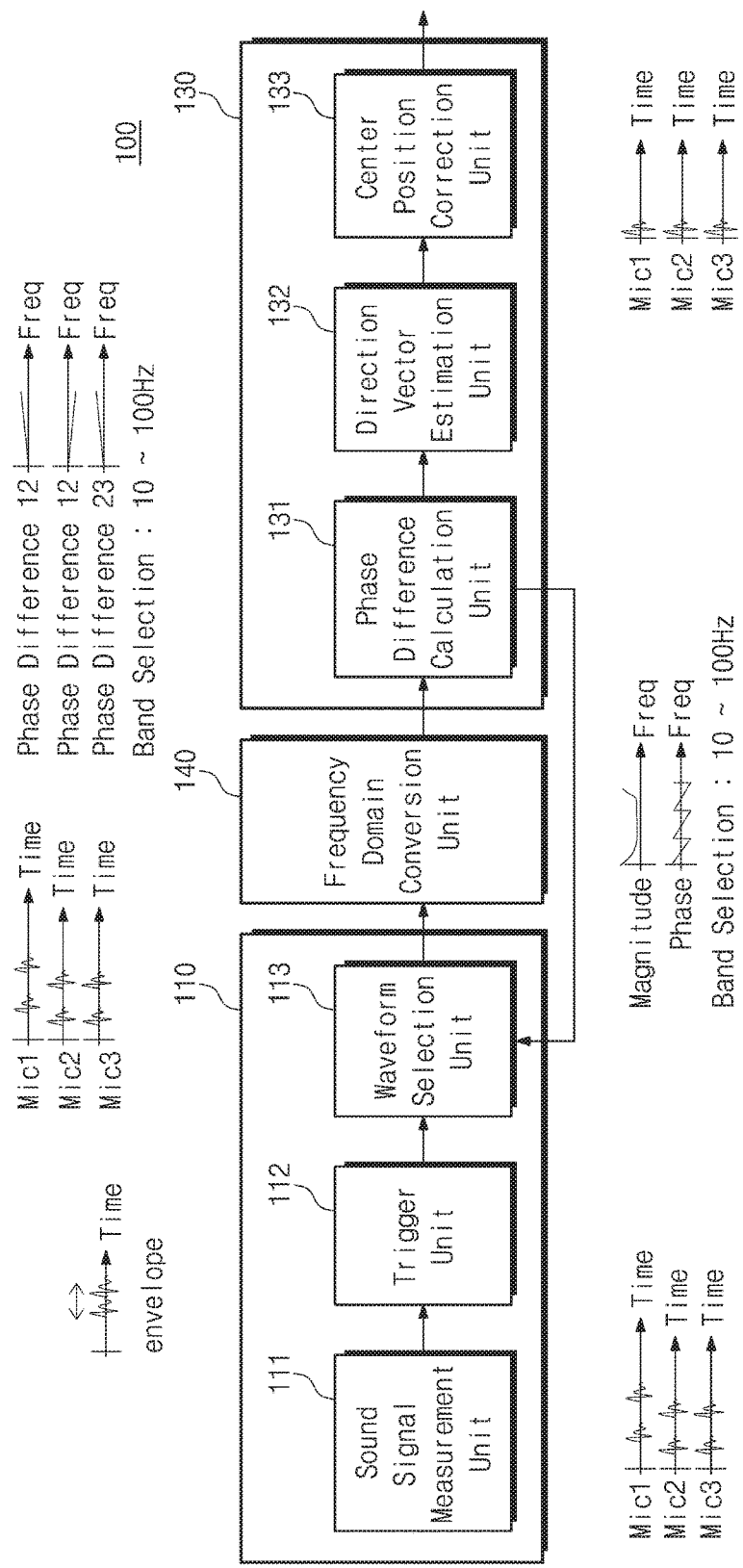
FIG. 1 is a diagram illustrating a time delay estimation device according to an embodiment of the present invention.

FIG. 1 illustrates the best mode for carrying out the present invention.

Mode for Carrying Out the Invention

Preferred embodiments of the present invention will be described below in more detail with reference to the accompanying drawings. It should be noted that only descriptions required for assisting with an understanding of operation of the present invention are provided below and unnecessary detailed descriptions are not provided below so as not to obscure the gist of the present invention.

The present invention provides a time delay estimation device capable of accurately estimating a time delay using a sound signal and a time delay estimation method for the time delay estimation device.

FIG. 1 is a diagram illustrating a time delay estimation device according to an embodiment of the present invention.

Referring to FIG. 1, a time delay estimation device 100 includes a sound signal detection unit 110, a frequency domain conversion unit 120, and a time delay estimation unit 130.

The sound signal detection unit 10 detects sound signals through a plurality of microphones. The sound signal detection unit 110 includes a sound signal measurement unit 111, a trigger unit 112, and a waveform selection unit 113.

The sound signal measurement unit 111 detects sound signals from a plurality of microphones. The sound signal measurement unit 111 is connected to the microphones to detect sound signals therefrom. Sound signals detected from three microphones are exemplarily illustrated under the sound signal measurement unit 111. The sound signal measurement unit 111 outputs detected sound signals to the trigger unit 112.

The trigger unit 112 extracts waveforms of sound signals through triggering of measured sound signals. The trigger unit 112 triggers each sound signal more than a preset reference time. Here, when sound signals, more than the preset reference time, are not triggered, the trigger unit 112 suspends an operation of estimating a time delay using sound signals. An operation of extracting waveforms of sound signals is illustrated above the trigger unit 112. The trigger unit 112 outputs extracted sound signals to the waveform selection unit 113.

The waveform selection unit 113 selects waveforms from the extracted sound signals to detect sounds signals for each microphone. That is, the waveform selection unit 113 selects waveforms present at a uniform time interval for each microphone. The waveform selection unit 113 sets reference times (for example, a time stamp) for selected waveforms, and performs zero padding. That is, the waveform selection unit 113 inserts zero (0) into portions in which selected waveforms are not present. The waveforms for which the reference times are set are illustrated for each microphone sound signal above the waveform selection unit 113. The operation of extracting waveforms of sound signals is illustrated on the trigger unit 112. The waveform selection unit 113 outputs zero-padded signals to the frequency domain conversion unit 120.

Furthermore, the waveform selection unit 113 may adjust the reference times applied to selected waveforms, in response to a reference time control signal output from a phase difference control unit.

The frequency domain conversion unit 120 converts detected sound signals into signals of a frequency domain. The frequency domain conversion unit 120 converts sound signals detected in a time domain into signals of a frequency domain. To this end, the frequency domain conversion unit 120 performs fast Fourier transform (FFT). Therefore, the frequency domain conversion unit 120 may be implemented with a fast Fourier transformer. The frequency domain conversion unit 120 sets a band for conversion into a frequency domain. An operation for converting a signal into a frequency domain is illustrated under the frequency domain conversion unit 120. Here, the band set in the frequency domain conversion unit 120 may be, for example, 10 MHz to 100 MHz, and a magnitude component and a phase component are separately illustrated. The frequency domain conversion unit 120 outputs, to the time delay estimation unit 130, the signals converted into a frequency domain.

The time delay estimation unit 130 measures a time delay from a slope of a phase difference between the sound signals converted into a frequency domain. The time delay estimation unit 130 includes a phase difference calculation unit 131, a direction vector estimation unit 132, and a center position correction unit 133.

The phase difference calculation unit 131 calculates a phase difference from the signals converted into a frequency domain. The phase difference calculation unit 131 calculates phase differences between the plurality of microphones, and outputs the reference time control signal for controlling the waveform selection unit 113 according to a condition for slopes (i.e., phase differences) of the calculated phase differences to converge to 0.

In this manner, the phase difference calculation unit 131 may adjust the reference times (for example, a time stamp) applied to selected waveforms. The phase difference calculation unit 131 may estimate a time delay on the basis of the slope of a phase difference, i.e., may estimate the time delay by adjusting the reference times that minimize the slope of a phase difference. A result of calculating, by the phase difference calculation unit 131, the phase difference between the sound signals received from the microphones is illustrated on the phase difference calculation unit 131. The phase difference calculation unit 131 outputs a time delay estimation result to the direction vector estimation unit 132.

The direction vector estimation unit 132 estimates a direction vector for detecting a location where a sound signal has occurred, i.e., a location of a sound source, on the basis of the time delay estimation result. The direction vector estimation unit 132 outputs estimated direction vector information to the center position correction unit 133.

The center position correction unit 133 corrects center positions of sounds signals of each microphone on the basis of a direction vector. Here, center-position-corrected sounds signals are illustrated under the center position correction unit 133. The center position correction unit 133 may generate average signal data through center position correction. Furthermore, the center position correction unit 133 outputs, to a module for calculating the location of a sound source, pieces of information obtained through time delay estimation and the average signal data.

Here, the module for calculating the location of a sound source may use an angle of arrival (AoA) technique, a time of arrival (ToA) technique, a time difference of arrival (TDoA) technique, etc.

In this manner, the time delay estimation device 100 of the present invention calculates a time delay on the basis of the slope of a phase difference between sound signals received in a frequency domain. In a non-dispersive sound signal in which a time delay has occurred, the time delay is presented as a linear phase change in a frequency domain. Therefore, as the phase difference calculation unit 100 calculates a time delay according to the slope of a phase difference, the phase difference calculation unit 100 may precisely measure a phase, and thus may more accurately estimate a time delay.

Figure 2:
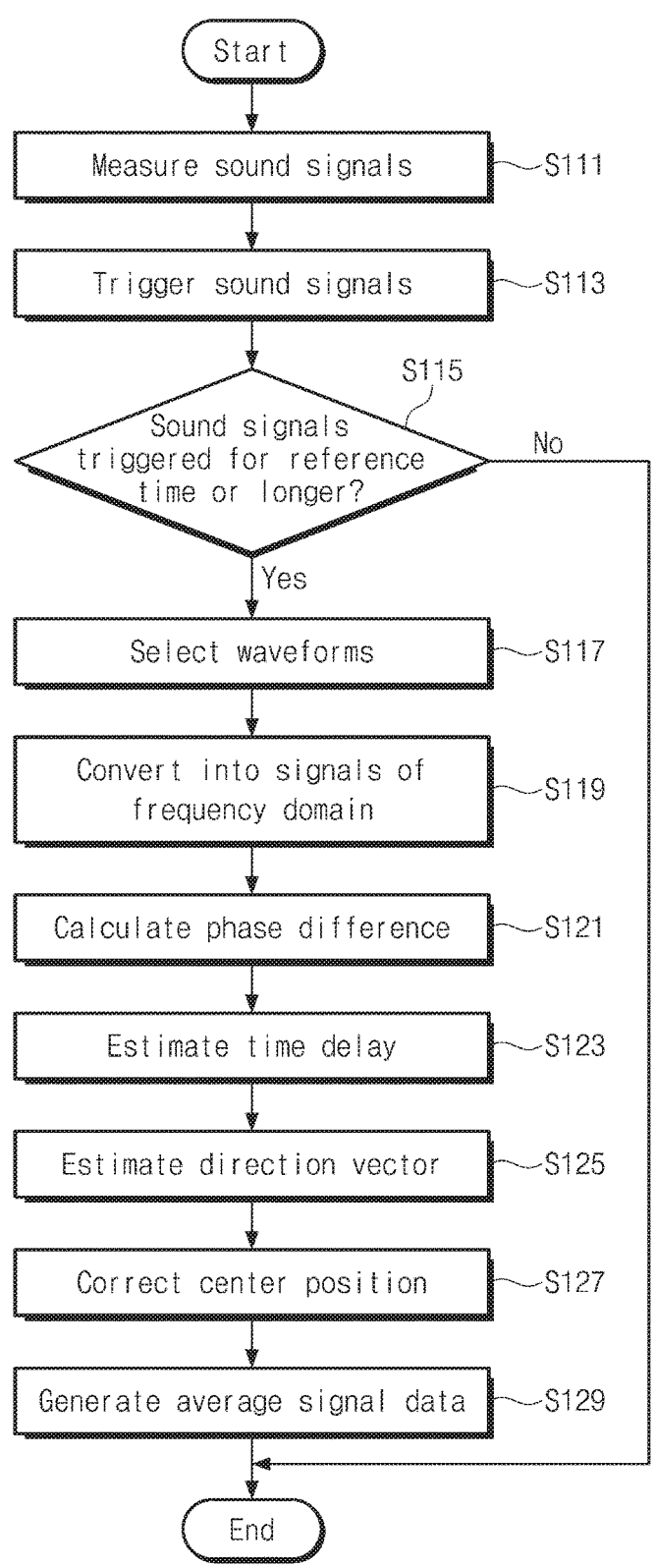
FIG. 2 is a flowchart illustrating a time delay estimation method according to an embodiment of the present invention.

FIG. 2 is a flowchart illustrating a time delay estimation method according to an embodiment of the present invention.

Referring to FIG. 2, the time delay estimation device 100 measures sound signals from a plurality of microphones (S111). The time delay estimation device 100 measures sound signals from the microphones.

The time delay estimation device 100 triggers sound signals on the basis of the measured sound signals. The time delay estimation device 100 extracts waveforms of the sound signals through triggering of the sound signals.

The time delay estimation device 100 determines whether triggered sound signals have been triggered more than at least a reference time (S113).

If the sound signals have not been triggered more than the reference time as a result of the determination, the process proceeds to an end step. That is, the time delay estimation device 100 ends a time delay estimation operation.

If the sound signals have been triggered more than the reference time as a result of the determination, the process proceeds to step S117.

The time delay estimation device 100 selects waveforms present at a uniform time interval from extracted sound signals (S117). The time delay estimation device 100 sets reference times (for example, a time stamp) respectively for selected waveforms, and performs zero padding.

The time delay estimation device 100 converts the selected waveforms into signals of a frequency domain (S119). The time delay estimation device 100 performs fast Fourier transform on the selected waveforms to convert the selected waveforms into signals of a frequency domain.

The time delay estimation device 100 calculates a phase difference between fast-Fourier-transformed signals (S121). For example, assumed that signals are received from three microphones, the time delay estimation device 100 calculates the phase difference between fast-Fourier-transformed signals from a first microphone and a second microphone, the phase difference between fast-Fourier-transformed signals from the second microphone and a third microphone, and the phase difference between fast-Fourier-transformed signals from the first microphone and the third microphone, respectively. The time delay estimation device 100 adjusts, on the basis of the calculated phase differences, the reference times set when selecting the waveforms. Here, the time delay estimation device 100 performs a control such that reference times are set to make the slope of a phase difference 0.

The time delay estimation device 100 estimates a time delay by setting the reference times which make the slope of a phase difference 0 (S123).

The time delay estimation device 100 estimates a direction vector on the basis of an estimated time delay (S125).

The time delay estimation device 100 corrects the center positions of the waveforms selected from each microphone, on the basis of the direction vector (S127).

The time delay estimation device 100 may generate average signal data from center-position-corrected waveforms (S129). In this manner, the time delay estimation device 100 may generate information for estimating the location of a sound source using the time delay, the direction vector, and the average signal data.

Figure 3:
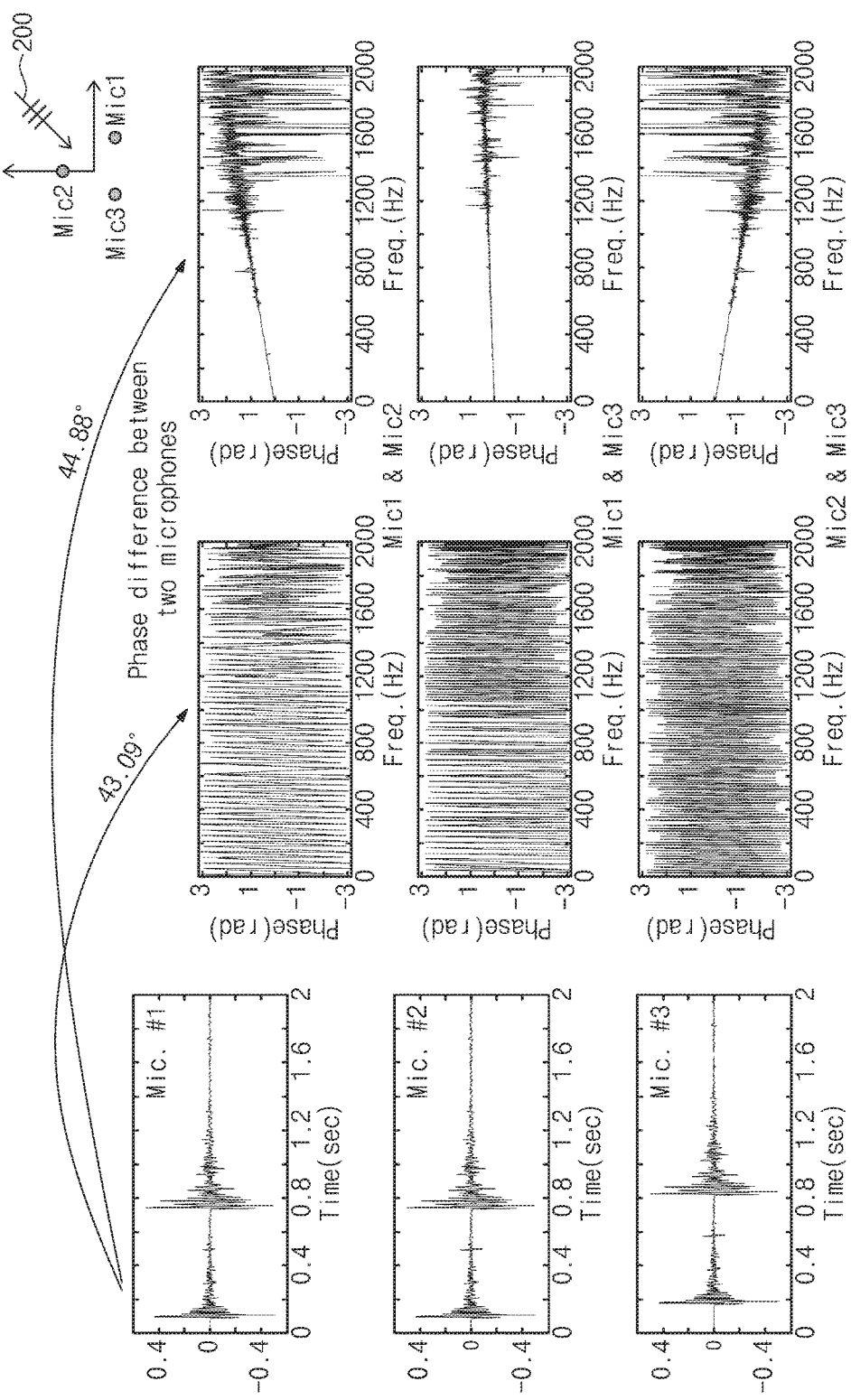
FIG. 3 is a diagram exemplarily illustrating a simulation of operation of time delay estimation according to an embodiment of the present invention.

FIG. 3 is a graph exemplarily illustrating a simulation of operation of time delay estimation according to an embodiment of the present invention.

Referring to FIG. 3, sound signals according to locations of first to third microphones for three microphones are illustrated. Here, an incident direction 200 of the sound signals is shown in FIG. 3.

Respective sound signals of the first to third microphones are illustrated with respect to a time axis at the right side of FIG. 3.

Here, the phase difference between the first microphone and the second microphone, the phase difference between the first microphone and the third microphone, and the phase difference between the second microphone and the third microphone are formed with a uniform slope with respect to a frequency axis.

As described above, the time delay estimation method of the present invention improves the accuracy of time delay estimation, and thus may be used in devices to which the AoA technique, the ToA technique, or the TDoA technique is applied.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The present invention relates to a location detection system, and may be particularly used in a time delay estimation device for estimating a time delay which has occurred in a sound signal.

The invention claimed is:

1. A time delay estimation device comprising:
   a sound signal detection unit configured to detect sound signals through a plurality of microphones;

a frequency domain conversion unit configured to convert the detected sound signals into signals of a frequency domain; and a time delay estimation unit configured to estimate a time delay on the basis of a slope of a phase difference between the sound signals converted into the frequency domain, wherein the time delay estimation unit comprises:

a phase difference calculation unit configured to calculate phase differences among the plurality of microphones and estimate the time delay on the basis of slopes of the calculated phase differences;

a direction vector estimation unit configured to estimate a direction vector on the basis of the time delay; and a center position correction unit configured to generate, on the basis of the estimated direction vector, average signal data through correction of a center position according to a reference time applied to a signal of each of the plurality of microphones.

2. The time delay estimation device of claim 1, wherein the sound signal detection unit comprises:

a sound signal measurement unit configured to measure sound signals from the plurality of microphones;

a trigger unit configured to trigger the measured sound signals to extract waveforms of the sound signals; and a waveform selection unit configured to select the extracted waveforms of the sound signals to detect sound signals for each of the plurality of microphones.

3. The time delay estimation device of claim 2, wherein the waveform selection unit generates the sound signals by zero-padding the selected waveforms and setting a time stamp for setting the reference time.

4. The time delay estimation device of claim 2, wherein the frequency domain conversion unit converts the detected sound signals into the signals of the frequency domain through fast Fourier transform.

5. The time delay estimation device of claim 1, wherein the phase difference calculation unit adjusts, on the basis of the calculated phase differences, positions of reference times respectively applied to the waveforms selected in the waveform selection unit, so as to satisfy a condition for the slope to converge to 0.

6. A time delay estimation method for a time delay estimation device, comprising:

detecting sound signals through a plurality of microphones;

converting the detected sound signals into signals of a frequency domain; and estimating a time delay on the basis of a slope of a phase difference between the sound signals converted into the frequency domain, wherein the estimating the time delay comprises:

calculating phase differences among the plurality of microphones and estimating the time delay from slopes of the calculated phase differences;

estimating a direction vector on the basis of the time delay; and generating, on the basis of the estimated direction vector, average signal data through correction of a center position according to a reference time applied to a signal of each of the plurality of microphones.

7. The time delay estimation method of claim 6, wherein the detecting the sound signals comprises:

measuring sound signals from the plurality of microphones;

extracting waveforms of the sound signals by triggering the measured sound signals; and detecting sound signals for each of the plurality of microphones by selecting the extracted waveforms of the sound signals.

8. The time delay estimation method of claim 7, wherein the extracting the waveforms of the sound signals comprises generating the sound signals by zero-padding the selected waveforms and setting a time stamp for setting the reference time.

9. The time delay estimation method of claim 7, wherein the converting the detected sound signals into the signals of the frequency domain comprises converting the detected sound signals into the signal of the frequency domain through fast Fourier transform.

10. The time delay estimation method of claim 6, wherein the estimating the time delay from the slopes of the calculated phase differences comprises adjusting, on the basis of the calculated phase differences, positions of reference times respectively applied to the selected waveforms, so as to satisfy a condition for the slope to converge to 0.

* * * * *